United States Patent [19]

Chiang

[11] 4,237,473

[45] Dec. 2, 1980

[54] GALLIUM PHOSPHIDE JFET

[75] Inventor: Alice M. Chiang, Framingham, Mass.

[73] Assignee: Honeywell Inc., Minneapolis, Minn.

[21] Appl. No.: 972,298

[22] Filed: Dec. 22, 1978

Related U.S. Application Data

[63] Continuation of Ser. No. 762,533, Jan. 26, 1977, abandoned.

[51] Int. Cl.³ .......................................... H01L 29/161
[52] U.S. Cl. ....................................... 357/61; 357/30; 357/22; 357/41; 357/45
[58] Field of Search ...................... 357/19, 22, 61, 30, 357/41, 45

[56] References Cited

U.S. PATENT DOCUMENTS

| | | | |
|---|---|---|---|
| 3,721,839 | 3/1973 | Shannon | 357/22 |
| 3,813,585 | 5/1974 | Tarui | 357/61 |
| 3,915,754 | 10/1975 | Schulze | 357/19 |

Primary Examiner—Edward J. Wojciechowicz
Attorney, Agent, or Firm—Theodore F. Neils

[57] ABSTRACT

A gallium phosphide metal semiconductor field-effect transistor (MESFET) or a junction field-effect transistor (JFET) exhibits very low leakage current, is radiation hard, and is capable of high operating temperatures.

33 Claims, 10 Drawing Figures

FIG. 1
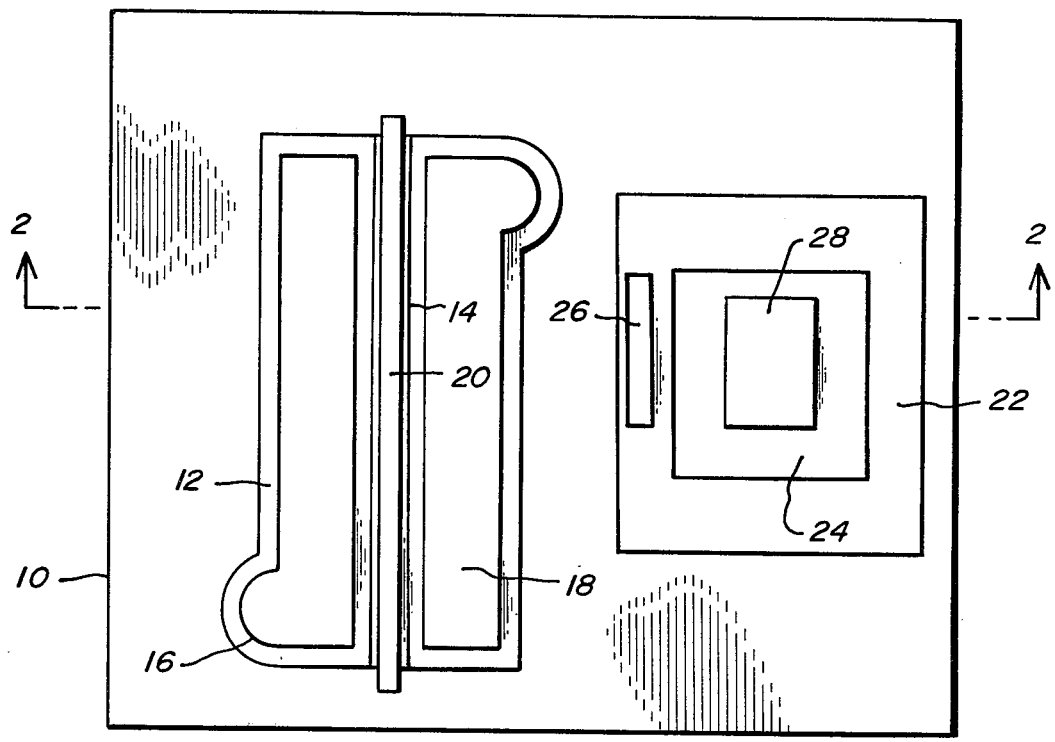
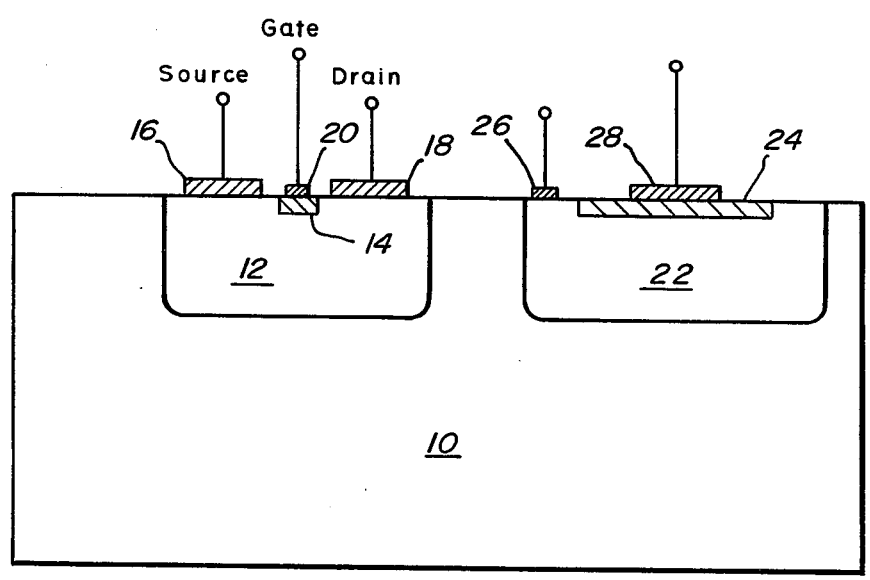
FIG. 2

FIG. 6
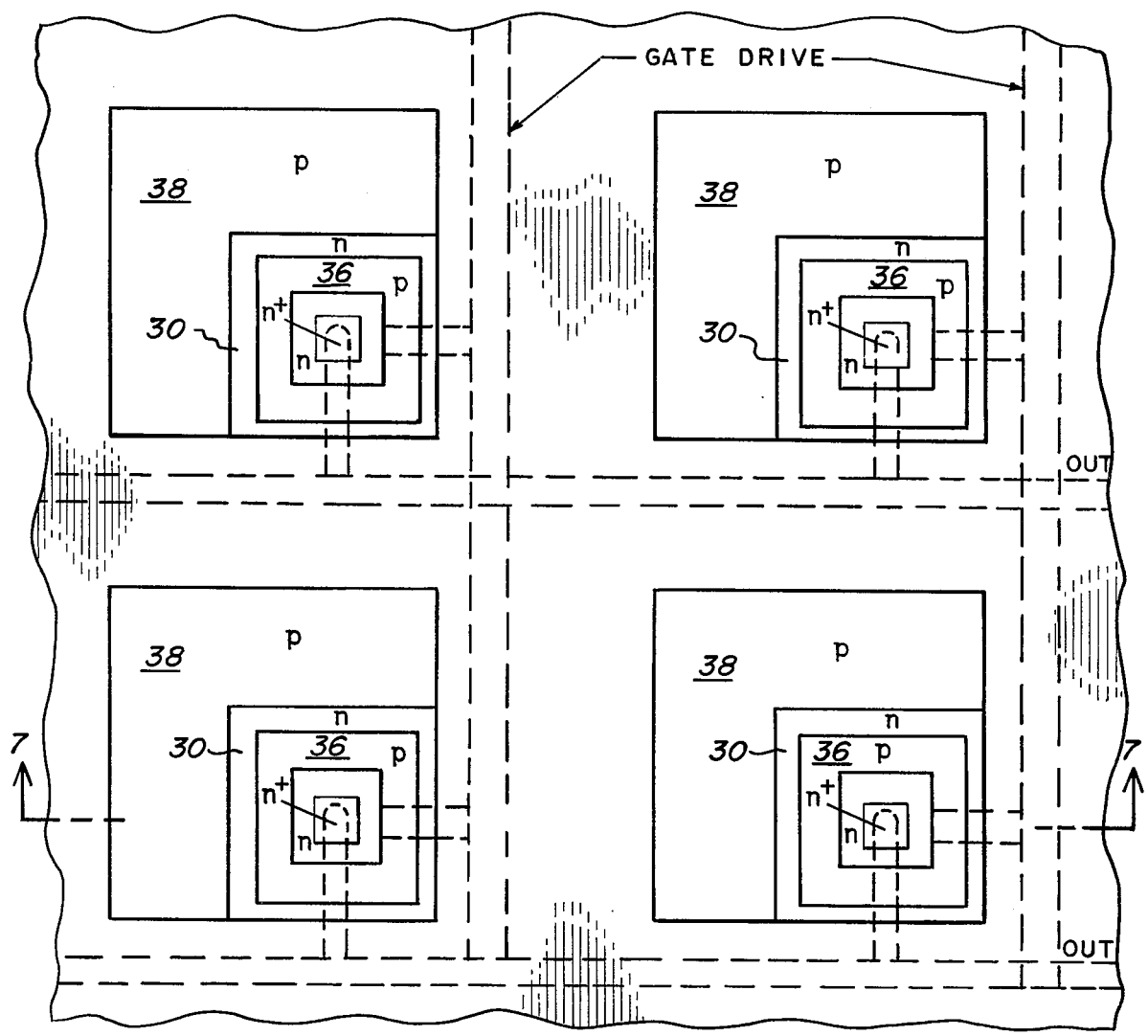
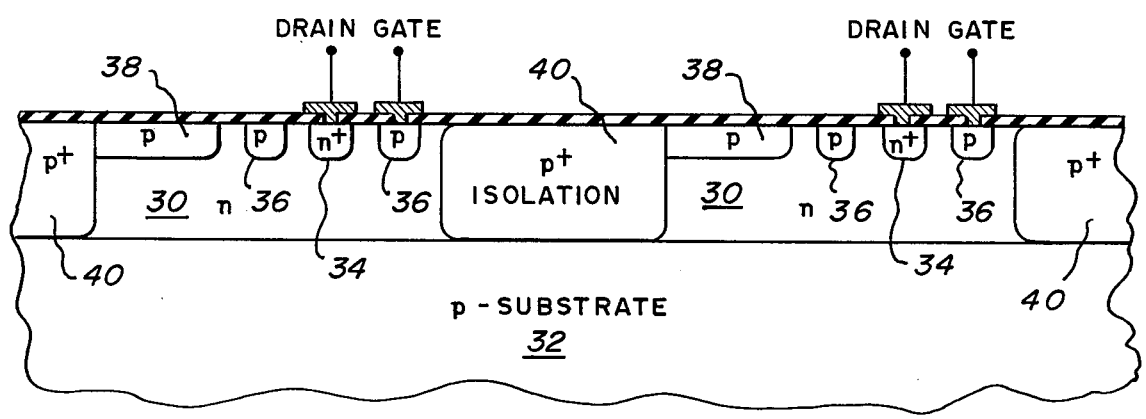
FIG. 7

GALLIUM PHOSPHIDE JFET

This is a continuation of application Ser. No. 762,533, filed Jan. 26, 1977, now abandoned.

BACKGROUND OF THE INVENTION

The present invention relates to semiconductor devices. In particular, the present invention is directed to a gallium phosphide (GaP) metal semiconductor field-effect transistor (MESFET) or a junction field-effect transistor (JFET). Gallium phosphide has the widest band gap of any of the commonly used semiconductor materials. Because of this, gallium phosphide can be used for many unique electronic devices, such as short wavelength (green) light emitting diodes and low-leakage diodes. Also, due to its low intrinsic carrier concentration, gallium phosphide devices have a potential use at very high temperatures (up to 500° C.). Much of the potential of this material, however, is currently untapped due to raw material availability and processing difficulties.

Single crystal GaP has historically been expensive and in short supply. This situation is improving, but high purity material is still not readily available.

There are several processing difficulties which are encountered with GaP. First, there is no native oxide which can be used as easily as $SiO_2$ is used in silicon semiconductor technology. A layer of $SiO_2$ or some other similar material, therefore, must be deposited on the GaP for use in planar fabrication processing. Although there are several methods available to deposit such layers (sputtering, chemical vapor deposition, and spin-on), all of these methods are time-consuming and add complexity to the process.

Second, GaP decomposes at temperatures higher than about 600° C. at one atmosphere pressure. This greatly complicates diffusions and anneals. Even though the melting point of gallium phosphide is over 1100° C., special precautions must be taken when the temperature is raised above 600° C. Third, diffusion impurities and techniques are very limited. Complicated doping profiles and shallow junctions are difficult to produce with diffusion techniques in GaP. Ion implantation, while it has been studied to some extent in GaP as an alternative to diffusion techniques, still requires further study.

For these reasons, the major use of GaP has been for light emitting diodes. Although some studies were performed in the 1950's and 1960's on potential use of GaP as a photodetector, it has only been in recent years that the more extensive studies of the photodetecting capabilities of GaP have been investigated.

The possible use of GaP in a field-effect type of device has been suggested on a number of occasions in the patent literature. See for example, U.S. Pat. Nos. 3,252,003; 3,304,469; 3,354,362; 3,381,187; 3,381,188; 3,753,055; and British Pat. No. 921,947. None of these references, however, describes a specific example of a GaP field-effect device or discloses the specific properties which such a device would have.

SUMMARY OF THE INVENTION

The present invention is a GaP MES field-effect transistor, and a GaP junction field-effect transistor. The GaP MESFET comprises a body of GaP having a first conductivity type substrate region, a second conductivity type channel region, and a Schottky barrier type gate region. The GaP JFET comprises a body of GaP having a first conductivity type substrate region, a second conductivity type channel region, and a first conductivity type gate region. In both devices the channel region has a carrier concentration which is less than $1 \times 10^{17}$ carriers/cm$^3$.

BRIEF DESCRIPTION OF THE DRAWINGS

FIG. 1 shows a top view of the GaP semiconductor device including an n-channel JFET and a p+ on n photodiode formed in a common GaP body.

FIG. 2 shows a cross-section of the GaP JFET and p+/n photodiode of FIG. 1.

FIG. 6 shows a top view of a preferred embodiment of a self-scanned GaP photodiode-JFET mosaic.

FIG. 7 shows a cross-sectional view of the device of FIG. 6.

DETAILED DESCRIPTION OF THE PREFERRED EMBODIMENTS

Figure 3:
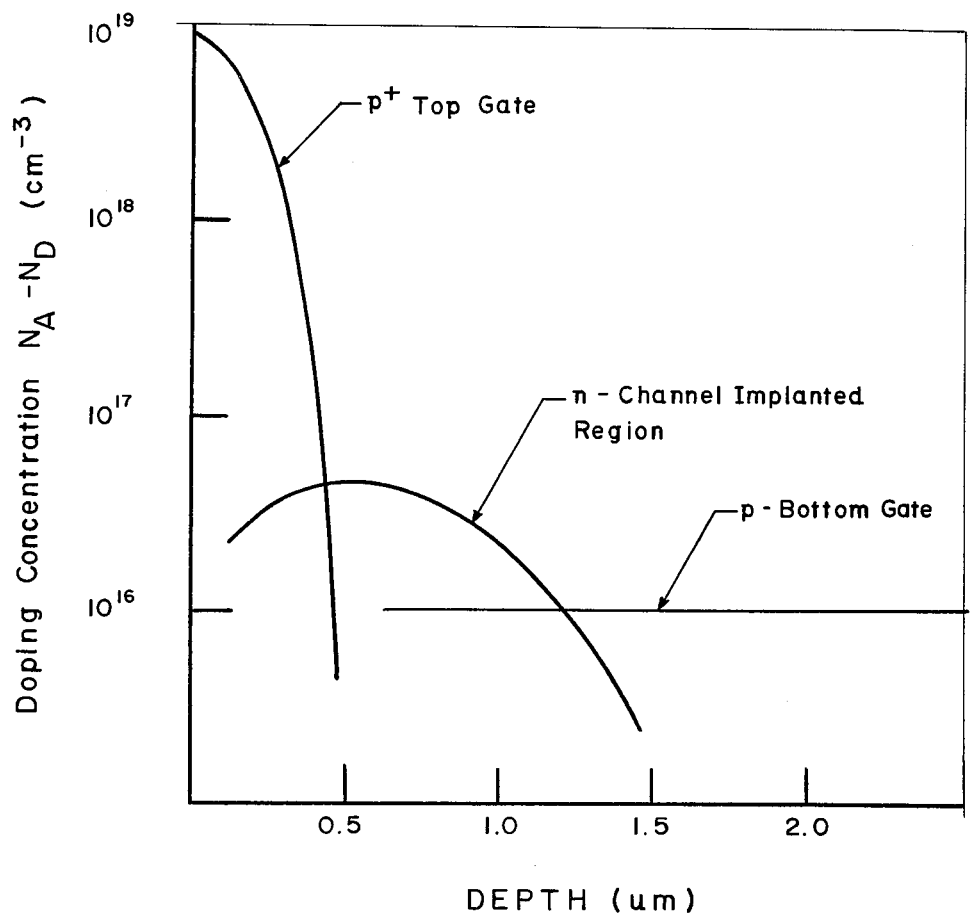
FIG. 3 shows doping profiles for the GaP JFET of FIGS. 1 and 2.

The present invention is directed to a GaP METAL SEMICONDUCTOR or junction field-effect transistor. This device is capable of low noise and low leakage current, is radiation hard, and is capable of high operating temperatures.

The GaP MESFET of JFET of the present invention has several important applications. First, it is an important part of a monolithic, self-scanned mosaic including GaP photodiodes associated with a low leakage current GaP MESFET or JFET switch which permits accessing or sampling of the individual photodiode.

Another important application of the GaP MESFET or JFET is as a transimpedance amplifier for use with pyroelectric detectors. The extremely low gate leakage current of the GaP MESFET or JFET makes it particularly suited for use with pyroelectric detectors.

GaP is a large bandgap semiconductor ($E_g = 2.25$ eV) which is inherently radiation harder than other commonly used semiconductor because of its relatively short minority carrier diffusion length and its relatively high bonding energy, which implies that higher radiation energy is needed to create an electron-hole pair (7.8 eV/pair). Because of these properties, GaP MESFET's and JFET's can take much higher radiation flux to reach the same degradation as can silicon or gallium arsenide devices. In addition, MESFET's and JFET's are majority carrier devices which can inherently tolerate a higher radiation doses than bipolar transistors and MOSFET's. Devices and systems utilizing the GaP MESFET or JFET, therefore, can be expected to be very radiation resistant.

FIG. 1 shows a top view of a GaP device including both an n-channel JFET and a p+ on n photodiode. FIG. 2 shows a cross-section of the structure shown in FIG. 1.

In FIGS. 1 and 2, the device is formed in a p-type GaP substrate 10. The JFET is formed by an n-type channel 12 in the p-type substrate. A p+ gate region 14 is formed in n-type channel 12. Source and drain contacts 16 and 18 are attached to n-channel 12 on opposite sides of gate region 14. Gate contact 20 is attached to gate region 14.

Also shown in FIGS. 1 and 2 are a p+ on n photodiode formed by n-type region 22 and p+ region 24. Electrical contacts 26 and 28 are made to n and p+ regions 22 and 24, respectively.

A device shown in FIGS. 1 and 2 may be formed by two ion implantation steps. The first step is ion implantation of a donor ion into a p-type substrate to form the n-type channel region 12 and the n-type region 22. The gate region 14 and the p+ region 24 are made by a second ion implantation. This second ion implantation involves implanting of acceptor ions. A suitable donor ion is selenium and a suitable acceptor ion is magnesium.

FIG. 3 shows preferred doping profiles for the GaP JFET of FIGS. 1 and 2. In the preferred embodiment of the present invention, n-type channel region 12 has a carrier concentration which is approximately equal to or less than $5 \times 10^{16}$ carriers/cm$^3$. This is required to ensure a relatively high breakdown voltage and to minimize noise. The preferred depth of the n-type channel region is less than about 1.5 microns.

When the device of FIGS. 1 and 2 is formed by ion implantation, the p-type substrate region 10 must be lightly doped p-type with a carrier concentration $N_A$-$N_D$ less than about $1 \times 10^{16}$ carriers/cm$^3$. This low carrier concentration substrate material is needed to ensure that the maximum carrier concentration in channel region 12 is approximately equal to or less than $5 \times 10^{16}$ carriers/cm$^3$. If only mid-$10^{16}$/cm$^3$ carrier concentration substrate material is available, this yields a channel region with $10^{17}$ carriers/cm$^3$ carrier concentration. A GaP JFET with such high carrier concentration in the channel region results in a low breakdown voltage and is difficult to be used as a practical device.

The p+ gate region 14 preferably has a depth of less than about 0.5 microns. The carrier concentration of the p+ gate region may be as high as $10^{19}$ carriers/cm$^3$.

Figure 4:
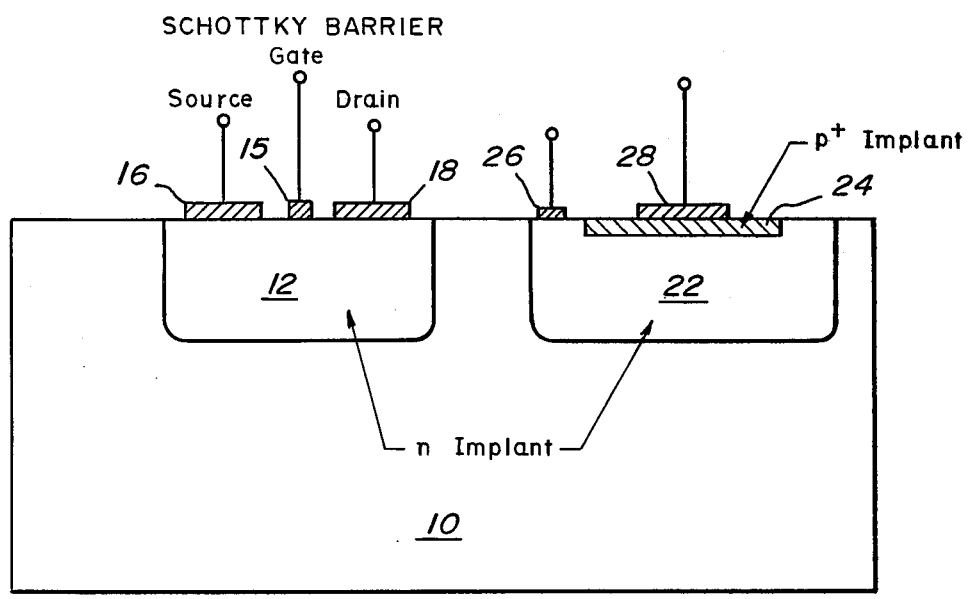
FIG. 4 shows a cross-section of a GaP MESFET and p+/n photodiode device.

FIG. 4 shows a cross-section of a GaP device which is generally similar to the device of FIG. 1, except that a GaP MESFET replaces the GaP JFET of FIG. 1. Since only the gate regions of the JFET and MESFET differ, similar numerals are used to designate similar elements. The device of FIG. 4 is formed in a p-type GaP substrate 10. The MESFET is formed by an n-type channel 12 and a Schottky barrier gate region 15 in n-type channel 12. Source and drain contacts 16 and 18 are attached to n-channel 12 on opposite sides of Schottky gate region 15. Also shown in FIG. 4 is a p+ on n photodiode formed by n-type region 22 and p+ region 24. Electrical contacts 26 and 28 are made to n and p+ region.

As in the JFET of FIG. 1, the MESFET of FIG. 4 requires a channel region 12 which has a carrier concentration less than $1 \times 10^{17}$ carriers/cm$^3$. The preferred carrier concentration of channel region 12 is approximately equal to or less than $5 \times 10^{16}$ carriers/cm$^3$.

Figure 5:
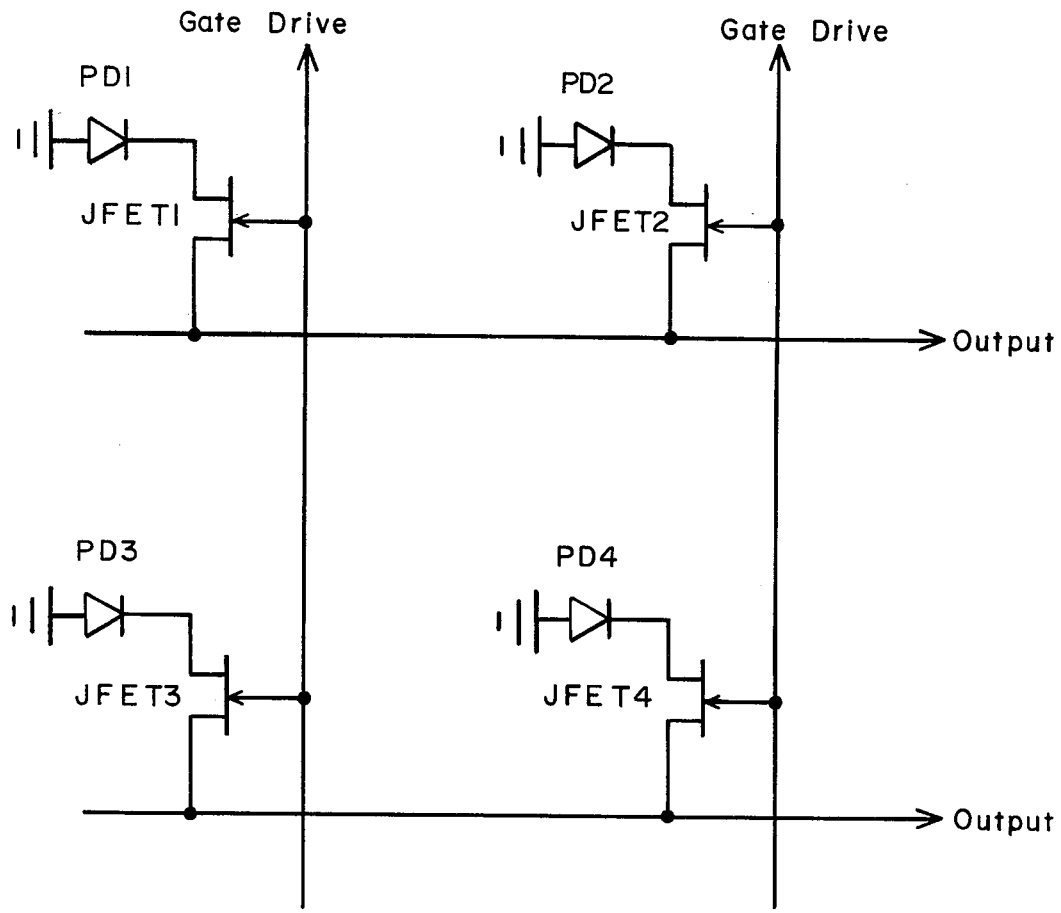
FIG. 5 shows a circuit diagram for a self-scanned GaP photodiode-JFET mosaic.

FIG. 5 shows a circuit diagram for a self-scanned GaP photodiode mosaic. For simplicity, only four GaP photodiodes PD1 through PD4 and four GaP junction field-effect transistors JFET1 through JFET4 are shown. In many systems, of course, the number of photodiodes and JFET's will be considerably larger.

In the mosaic of FIG. 5, each JFET has its gate electrode connected to a gate drive column electrode. The source of each JFET is connected to the cathode of the associated photodiode, and the drain electrode is connected to an output row electrode.

When a particular gate drive electrode is energized, each JFET connected to that particular gate drive electrode is switched from a non-conductive to a conductive state. The particular photodiodes associated with those JFET's are effectively connected to the corresponding output row electrode. Parallel readout of an entire column of photodiodes, therefore, is achieved.

FIGS. 6 and 7 show a preferred embodiment of the self-scanned mosaic of FIG. 5. FIG. 6 is a top view of the mosaic in which the passivation layer and electrodes have been removed for clarity. The electrode patterns are shown in phantom in FIG. 6. FIG. 7 is a cross-sectional view.

The device shown in FIGS. 6 and 7 is preferably fabricated by liquid phase epitaxial growth of an n-type layer 30 of GaP on a p-type substrate 32 of GaP. The n-type layer 30 has a carrier concentration which is less than about $5 \times 10^{16}$ carriers/cm$^3$. In the device of FIGS. 6 and 7, n-type layer 30 forms the n-channel of the GaP JFET as well as the cathode of the GaP photodiode.

In the n-channel JFET of FIGS. 6 and 7, an n+ drain region 34 is formed in n-type channel 30. The drain region is surrounded by p-type gate region 36. Since the n-type source of the GaP JFET is connected to the n-type cathode of the GaP photodiode, no external metalization or connection is required. The JFET source and the photodiode cathode are both formed by the n-type material immediately adjacent to p-type region 38 of the photodiode. A p+ isolation region 40 surrounds each photodiode-JFET of the mosaic.

In the preferred embodiments of the present invention, the structure of FIGS. 6 and 7 is formed by two ion implantation processes. By appropriate masking, gate 36, p-type region 38, and p+ isolation region 40 are formed by ion implantation of acceptor impurities such as magnesium into n-type epitaxial layer 30. The n+ drain contact region 34 is formed by ion implantation of donors such as selenium. The self-scanned mosaic of FIGS. 6 and 7 has many advantages. First, it is a monolithic structure entirely of GaP. Second, the GaP JFET switch is a low leakage current device. Third, the mosaic is very radiation resistant because of the relatively short minority carrier diffusion length and the high bonding energy of GaP.

In one preferred embodiment of the present invention, the required performance of the GaP JFET includes gate leakage current $\leq 10^{-13}$ amps, transconductance $\geq 20$ $\mu$mho; operating frequency $\geq 500$ kilohertz; gate length $L \leq 2$ mil; and a gate geometry factor $Z/L \geq 10$, where Z is the gate width. These performance criteria allow the GaP JFET to be used both as a switch in a GaP photodiode mosaic configuration as well as a low-noise transimpedence amplifier, such as may be required for use with pyroelectric detectors.

To further appreciate the operation of the GaP JFET or MESFET of the present invention, a discussion of the theory of operation of a JFET is appropriate. The theory of operation of a MESFET is essentially the same as that of a JFET, and will not be discussed separately.

Figure 8:
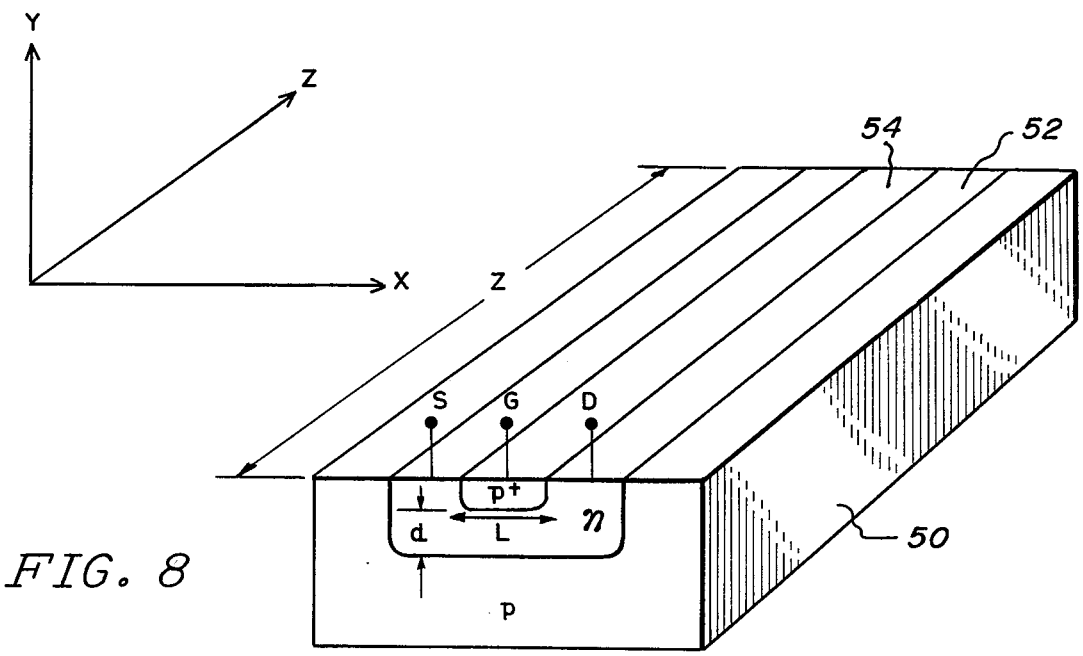
FIG. 8 shows a simplified configuration for a GaP n-channel JFET.

A JFET is essentially a semiconductor current path whose conductance is controlled by applying an electric field perpendicular to the current. The electric field results from reverse biasing a p-n junction. FIG. 8 shows a simplified configuration for an n-channel GaP JFET. The JFET includes a p-type substrate region 50, an n-type channel region 52 and a p+ type gate region 54. Source and drain electrodes are connected on opposite sides of n-channel 52. The voltage applied to the gate electrode connected to gate region 54 controls the current flow between the source and drain electrodes.

For the purposes of this discussion, the gate region 54 has a length L of 2 mils, a width Z of 20 mils, and a geometry factor Z/L of 10. The depth d of n-channel 52 is 0.6 microns, the carrier concentration within channel 52 is $N_d = 5 \times 10^{16}$ carriers/cm$^3$; and the electron mobility in n-type channel 52 is 50 cm$^2$/volt-second. With these parameters, the basic characteristics of the GaP JFET of the present invention can be defined.

The first characteristic to be considered is the current-voltage characteristic. The current density in the X-direction (i.e., transport along the channel) is given by:

$$J_x = \sigma(x) E_x \tag{1}$$

where $J_x$ is the current density, $\sigma(x)$ the conductivity, and $E_x$ the electric field along the x-direction ($-\partial V/\partial x$). Assuming a uniformly doped channel region (i.e., $N_d(y) = N_d$), the conductivity of channel 52 can be expressed as:

$$\sigma(x) = q N_d \mu \tag{2}$$

Substituting eq. (2) into (1), the channel (drain current is then given by:

$$I_D = N_d q \mu Z (d - y(x))(dV/dx) \tag{3}$$

where y(x) is the depletion region width for a p+n abrupt junction at a distance x from the source, i.e.

$$y(x) = \sqrt{\frac{\kappa_s \epsilon_o (V(x) + \phi_B - V_G)}{q N_d}} \tag{4}$$

In Eq. (4), $\phi_B$ is the built-in potential given by (kT/q) ln ($N_d/n_i$) for an abrupt p+n junction and $k_s$ is the dielectric constant of the semiconductor and $V_G$ is the gate voltage.

Substituting Eq. (4) into (3) and integrating with the boundary conditions: (a) $V = V_D$ at x=L, (b) V=0 at x−0, the fundamental current-voltage equation of a junction field-effect transistor is obtained:

$$I_D = G_o \{V_D - \tfrac{2}{3} \sqrt{\frac{2\kappa_s \epsilon_o}{q N_d}} [(V_D \phi_B - V_G)^{3/2} - (\phi_B - V_G)^{3/2}]\} \tag{5}$$

where:

$$G_o = \frac{Z q \mu N_d d}{L} \tag{5}$$

is the conductance of the metallurgical channel; i.e., the conductance of the n-type layer 52 between the two p-type regions 50 and 54 discounting the presence of the depletion region altogether.

As the drain voltage $V_D$ is increased, the resistance of the channel increases. When $V_D$ reaches a large enough value where the depletion region width equals the channel depth d, the corresponding voltage is called the pinch-off voltage. Beyond this point the channel current remains essentially at a constant value. This pinch-off voltage is given by;

$$V_{D,sat} = \frac{q N_d d^2}{2 \kappa_{so}} - \phi_B + V_G \tag{6}$$

Figure 9:
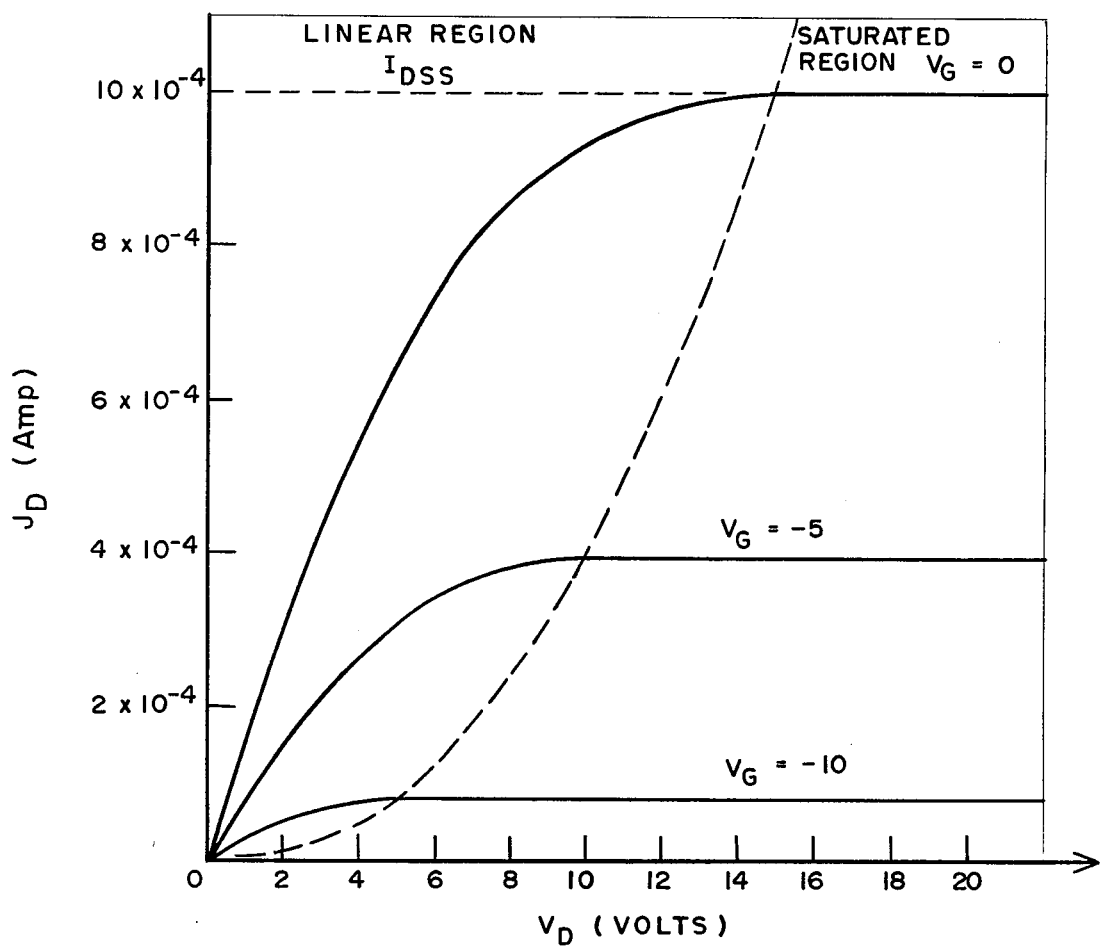
FIG. 9 shows current-voltage characteristics of a GaP n-channel JFET.

The application of a gate voltage, $V_G$, lowers the drain voltage required for the on-set of saturation by an equal amount. A calculated current-voltage characteristic of a GaP n-channel having the parameters previously listed, is shown in FIG. 9.

The second characteristic of the GaP JFET which can be analyzed is channel conductance, for small drain voltage (i.e., for $V_D < \phi_B - V_G$), the current voltage characteristics of the JFET can be simplified as:

$$J_D \cong G_o \left[ 1 - \sqrt{\frac{2\kappa_s \epsilon_o (\phi_B - V_G)}{q N_d d^2}} \right] V_D \tag{7}$$

The channel conductance, g., of the JFET is given by:

$$g = \frac{\partial I_D}{\partial V_D} \bigg| V_G = \text{const.} \tag{8}$$

Substituting (7) into (8), one obtains:

$$g = G_D \left[ 1 - \sqrt{\frac{2\kappa_s \epsilon_o (\phi_B - V_G)}{q N_d d^2}} \right] V_D \tag{9}$$

Figure 10:
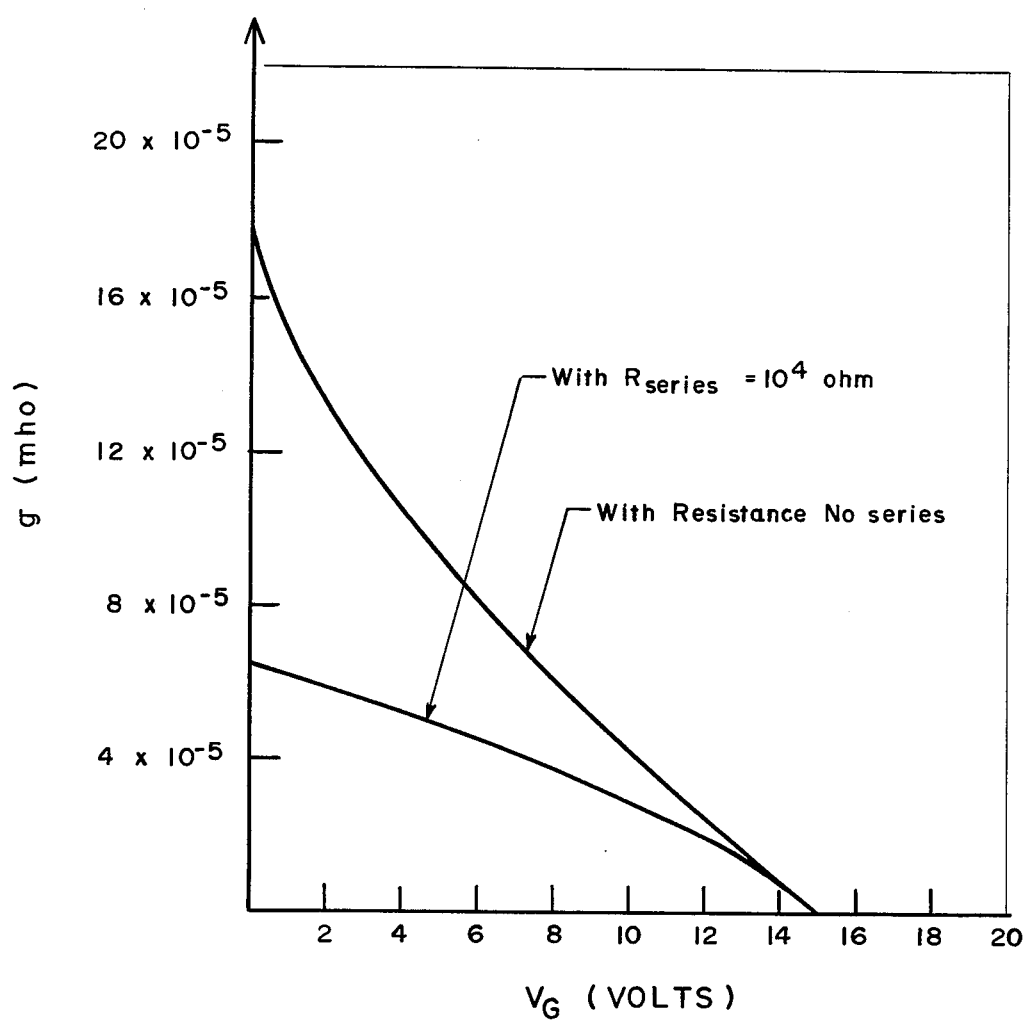
FIG. 10 shows channel conductance of a GaP n-channel JFET as a function of gate voltage in the linear region.

In FIG. 10, calculated channel conductance of a GaP n-channel JFET having the previously listed parameters is plotted as a function of gate voltage in the linear region ($V_D$ small).

The previous channel conductance in the linear region is calculated based on Eq. (7). The series resistances between the source and drain voltage contact and the channel region are assumed to be negligible. For practical cases, the presence of series resistance between source and drain contacts and the channel region has to be considered. The effect of series resistance on channel conductance is also shown in FIG. 10.

A third important property of JFET is the transconductance $g_m$, which is defined by:

$$g_m = \frac{\partial I_D}{\partial V_D} \bigg| V_G = \text{const} \tag{10}$$

Substituting Equation (5) into (10) yields:

$$g_m = G_o \sqrt{\frac{Z \kappa_s \epsilon_o}{q N_d d^2}} \left[ \sqrt{V_D + \phi_B - V_G} - \sqrt{\phi_B - V_G} \right] \tag{11}$$

The transconductance in the linear region can be obtained by expanding the bracket terms. It yields:

$$g_m = G_o \sqrt{\frac{2\kappa_s \epsilon_o}{q N_d d^2}} \; 2 \frac{V_D}{\sqrt{\phi_B - V_G}} . \tag{12}$$

The transconductance in the saturation region can be calculated by inserting $V_D = V_{D,sat}$ into Equation (11). This yields:

$$g_{m\,sat} = G_o \left[ 1 - \sqrt{\frac{2\kappa_s \epsilon_o (\phi_B - V_G)}{q N_d d^2}} \right] . \tag{13}$$

It can be seen that the expression for the transconductance in the saturation region, Equation (13), is exactly the same as the conductance in the linear region, Equation (9).

A fourth important characteristic is the gate leakage current. Because the gate is reverse biased with respect to the channel, the current flowing to the gate terminal is the reverse-biased leakage current of a p-n junction, which is given by:

$$I_g = \tfrac{1}{2} \frac{q n_i d ZL}{\tau} \tag{14}$$

where ZL is the cross-section area of the p-n junction. Because GaP is a large bandgap semiconductor, its room temperature intrinsic carrier, $n_i$, is very small ($n_i < 10 \text{ cm}^{-3}$). Using the previously listed device parameters and $\tau = 10^{-10}$ s, Equation (14) yields:

$$I_g << 10^{-14} \text{ amp.}$$

The fifth characteristic to be determined is the cut-off frequency for transconductance. The response time, $t_o$, of a JFET can be defined as the time n in which the change in drain current makes up the change in the total charge on the gate, i.e.:

$$t_o = \frac{\Delta Q_G A_G}{\Delta I_D} = \frac{\Delta Q_G A_G}{\Delta V_G} \frac{\Delta V_G}{\Delta I_D} = \frac{C_G}{g_m} . \tag{15}$$

Here $C_G$ is the total gate compacitance of the device, given by:

$$C_G = 2 ZL \frac{\kappa_s \epsilon_o}{\overline{W}} \tag{16}$$

where $\overline{W}$ is the average depletion region width. The maximum frequency of operation of the GaP JFET is then given by the frequency corresponding to this charging time constant.

$$f_o = \frac{1}{t_o} = \frac{g_m}{C_G} . \tag{17}$$

A simple estimate of the upper limit of $f_o$ can be obtained from the ratio of the maximum transconductance to the minimum gate capacitance. It yields:

$$f_o < \frac{q u N_D d^2}{\kappa_s \epsilon_o L^2} . \tag{18}$$

Note that this limiting frequency is proportional to the mobility and inversely proportional to the square of the gate length. Therefore, as the gate length decreases, the cut-off frequency increases. For that reason, the preferred embodiments of the present invention have a gate length $L \leqq 2$ mils.

In conclusion, the GaP JFET or MESFET of the present invention is a highly advantageous cemiconductor device. It provides high performance and is capable of integration with GaP photodetectors. The very low gate leakage makes the device particularly advantageous for use as a low-noise transimpedance amplifier.

Although the present invention has been described with reference to a series of preferred embodiments, workers skilled in the art will recognize that changes can be made in form and detail without departing from the spirit and scope of the invention. For example, although the specific embodiments described utilized an n-type channel region, p-channel GaP JFETS and MESFETS may also be used. As in the case of an n-channel GaP JFET, the channel region must have a carrier concentration which is less than $1 \times 10^{17}$ carriers/cm$^3$. Carrier concentrations of less than or equal to about $5 \times 10^{16}$ are preferred. In most applications, however, the n-channel GaP JFET or MESFET is preferred because the electron mobility in GaP is greater than the hole mobility. As described previously, the mobility affects a number of the important characteristics of the JFET or MESFET.

The embodiments of the invention in which an exclusive property or right is claimed are defined as follows:

1. A field-effect transistor comprising:
  a body of GaP having a first conductivity type except in selected regions thereof;
  a channel region in one of the selected regions in the body being of a second conductivity type with this second conductivity type of the channel region being opposite the first conductivity type of the body, the channel region doped to provide therein a carrier concentration of $<1 \times 10^{17}$ carriers/cm3;
  a pair of second conductivity type regions, separated by and joined to the channel region, which are capable of serving at least as source and drain regions into which and out of which primary currents through the field-effect can pass upon the source and drain regions being electrically energized; and
  a gate region sufficiently adjacent the channel region to be capable of affecting, upon being electrically energized, any current flow occurring through the channel region as a result of any electrical energization of the source and drain regions.

2. The field-effect transistor of claim 1 wherein the channel region is doped to provide therein a carrier concentration of $\leqq$ about $5 \times 10^{16}$ carriers/cm$^3$.

3. The field-effect transistor of claim 2 wherein the body, except in the selected regions thereof, is doped to provide therein a carrier concentration $\leqq$ about $1 \times 10^{16}$ carriers/cm$^3$.

4. The field-effect transistor of claim 1 wherein the gate region is in the body and is a region of the first conductivity type doped to provide therein a carrier concentration greater than that of the channel region.

5. The field-effect transistor of claim 4 wherein the gate region has a length $L \leqq 2$ mils.

6. The field-effect transistor of claim 5 wherein the gate region has a width $Z \geqq 10 \, L$.

7. The field-effect transistor of claim 4 wherein the gate region has a depth of less than about 0.5 microns.

8. The field-effect transistor of claim 7 wherein the channel regions has a depth of less than about 1.5 microns.

9. The field-effect transistor of claim 1 wherein the gate region is a Schottky barrier type gate region.

10. The field-effect transistor of claim 1 wherein the first conductivity type is p-type and the second conductivity type is n-type.

11. The field-effect transistor of claim 1 wherein the first conductivity type is n-type and the second conductivity type is p-type.

12. A semiconductor device comprising: a body of GaP;
   a GaP field-effect transistor, the GaP field-effect transistor having a gate region and further having a pair of regions in the body serving at least as source and drain regions; and
   a GaP photodiode, the GaP photodiode having a pair of regions in the body serving at least as anode and cathode regions with a selected one of these anode and cathode regions electrically in common with the source region of the GaP field-effect transistor, said selected one of said anode and cathode regions being doped to substantially the same level as is said source region.

13. The semiconductor device of claim 12 wherein the GaP field-effect transistor has the source region thereof electrically connected to the cathode region of the GaP photodiode.

14. The semiconductor device of claim 13 wherein the source region of the GaP field-effect transistor and the cathode region of the GaP photodiode are in physical contact with one another.

15. The semiconductor device of claim 12 wherein the GaP field-effect transistor is a GaP JFET.

16. The semiconductor device of claim 12 wherein the GaP field-effect transistor is a GaP MESFET.

17. The field-effect transistor of claim 1 wherein there is a substrate region of the first conductivity type in the body.

18. The semiconductor device of claim 13 wherein the field-effect transistor is an n-channel GaP field-effect transistor.

19. The field-effect transistor of claim 17 wherein the gate region is in the body and is a region of the first conductivity type doped to provide therein a carrier concentration great than that of the channel region.

20. The field-effect transistor of claim 17 wherein the gate region is a Schottky barrier type gate region.

21. The semiconductor device of claim 18 wherein the GaP body is of p-type conductivity except in selected regions thereof and wherein the GaP field-effect transistor further comprises a channel region in one of the selected regions in the body which is of n-type conductivity, the channel region doped to provide therein a carrier concentration of $<1 \times 10^{17}$ carriers/cm$^3$ and separating, but joined to, the n-type conductivity source and drain regions into which and out of which primary currents through the field-effect transistor can pass upon the source and drain regions being electrically energized with the gate region being sufficiently adjacent the channel region to be capable of affecting, upon being electrically energized, any current flow occurring through the channel region as a result of any electrical energization of the source and drain regions.

22. The semiconductor device of claim 21 wherein the GaP photodiode anode region in the body is of p-type conductivity, and wherein the cathode region thereof is one of the selected regions in the body which is of n-type conductivity and is the n-type conductivity region jointly serving as the drain region of the GaP field-effect transistor.

23. The semiconductor device of claim 22 wherein there is a substrate region of a p-type conductivity in the body.

24. The semiconductor device of claim 22 wherein the GaP field-effect transistor and the GaP photodiode are formed in a layer in the body and are together electrically isolated in the layer from other portions of the layer by p-type conductivity isolating regions.

25. The semiconductor device of claim 23 wherein the GaP field-effect transistor and the GaP photodiode are formed in a layer in the body and are together electrically isolated in the layer from other portions of the layer by p-type conductivity isolating regions.

26. The semiconductor device of claim 25 wherein the channel region is doped to provide therein a carrier concentration $\leq$ about $5 \times 10^{16}$ carriers/cm$^3$.

27. The semiconductor device of claim 25 wherein the substrate region is doped to provide therein a carrier concentration $\leq$ about $1 \times 10^{16}$ carriers/cm$^3$.

28. The semiconductor device of claim 25 wherein the gate region is in the body and is a region of p-type conductivity doped to provide therein a carrier concentration greater than that of the channel region.

29. The semiconductor device of claim 25 wherein the gate region is a Schottky barrier type gate region.

30. The field-effect transistor of claim 1 wherein the field-effect transistor has a photodiode electrically connected thereto.

31. The field-effect transistor of claim 1 wherein the field-effect transistor has a pyroelectric detector electrically connected thereto.

32. The field-effect transistor of claim 30 wherein the photodiode is electrically connected to the source region with the field-effect transistor being capable of being operated as an electrical switch.

33. The field-effect transistor of claim 31 wherein the pyroelectric detector is electrically connected to the gate region with the field-effect transistor being capable of being operated as a trans-impedance amplifier.

* * * * *